United States Patent
Lao et al.

(10) Patent No.: US 6,803,252 B2
(45) Date of Patent: Oct. 12, 2004

(54) SINGLE AND MULTIPLE LAYER PACKAGING OF HIGH-SPEED/HIGH-DENSITY ICS

(75) Inventors: Binneg Y. Lao, Rancho Palos Verdes, CA (US); William W. Chen, Westchester, CA (US); David A. Rowe, Torrance, CA (US); Inho Kim, Palo Alto, CA (US)

(73) Assignee: Sierra Monolithics, Inc., Redondo Beach, CA (US)

( * ) Notice: Subject to any disclaimer, the term of this patent is extended or adjusted under 35 U.S.C. 154(b) by 0 days.

(21) Appl. No.: 09/990,247

(22) Filed: Nov. 21, 2001

(65) Prior Publication Data

US 2003/0096447 A1 May 22, 2003

(51) Int. Cl.[7] .......................... H01L 21/44; H01L 21/50
(52) U.S. Cl. ...................... 438/106; 438/122; 438/123
(58) Field of Search ............................... 438/106, 121, 438/122, 123

(56) References Cited

U.S. PATENT DOCUMENTS

| | | | |
|---|---|---|---|
| 3,715,635 A | 2/1973 | Michel et al. | 317/234 R |
| 4,410,906 A | 10/1983 | Grabbe | 357/80 |
| 4,751,482 A | 6/1988 | Fukuta et al. | 333/247 |
| 5,006,820 A | 4/1991 | Prioste et al. | 333/33 |
| 5,021,759 A | 6/1991 | Gamand et al. | 333/246 |
| 5,307,237 A * | 4/1994 | Walz | 361/718 |

(List continued on next page.)

Primary Examiner—Amir Zarabian
Assistant Examiner—Pamela E Perkins
(74) Attorney, Agent, or Firm—Hogan & Hartson L.L.P.; Soyeon P. Laub

(57) ABSTRACT

Methods and apparatus for providing connection packages for high-speed integrated circuits ("ICs") in optical, electronic, wired or wireless communications are disclosed. The connection package achieves dimensional transformation of signal routes from high-speed, high-density IC's input/output pads to the external terminals such as coaxial terminals and BGA balls, while maintaining constant characteristic impedance throughout the transmission lines. A package may include a substrate having microstrips for communicating signals between the IC pads and external terminals. A pair of differential microstrips can be positioned closer to each other near the IC pads and create capacitive coupling. Such coupled capacitance allows the width of the microstrips to be reduced. A portion of the coupled microstrips near the IC pads can be widened to increase the capacitance so that the overall transmission path can become an all-pass network—from the IC pads, through the bonding wires, to the microstrips. The rest of the portions of the microstrips can be tapered out to their respective external connectors. In addition, a multi-layer package may include a substrate, at least one coaxial external terminal formed at the side of the package for conducting a high-speed signal, BGA connectors formed at the bottom of the package for conducting low-speed signals, a microstrip for connecting the high-speed signal to the coaxial terminal, and microstrips and internal coaxial connectors for connecting the low-speed signals to the BGA connectors. Substantially constant characteristic impedance is achieved throughout the signal transmission paths in the package.

56 Claims, 11 Drawing Sheets

U.S. PATENT DOCUMENTS

| | | |
|---|---|---|
| 5,334,962 A | 8/1994 | Higgins et al. .............. 333/247 |
| 5,373,187 A | 12/1994 | Sugino et al. .............. 257/664 |
| 5,376,909 A | 12/1994 | Nelson et al. .............. 333/247 |
| 5,400,003 A | 3/1995 | Kledzik ....................... 333/247 |
| 5,424,693 A | 6/1995 | Lin ............................. 333/33 |
| 5,668,408 A | 9/1997 | Nicholson .................. 257/699 |
| 5,677,570 A | 10/1997 | Kondoh et al. |
| 5,814,889 A | 9/1998 | Gaul .......................... 257/773 |
| 5,995,261 A * | 11/1999 | Asous ........................ 359/163 |
| 6,028,348 A * | 2/2000 | Hill ............................ 257/666 |
| 6,137,693 A | 10/2000 | Schwiebert et al. ........ 361/803 |
| 6,201,403 B1 | 3/2001 | Rollin et al. ................ 324/765 |
| 6,441,697 B1 * | 8/2002 | Garland et al. .............. 333/34 |
| 6,483,182 B2 | 11/2002 | Rosenberger |
| 6,486,755 B2 * | 11/2002 | Aruga ........................ 333/246 |
| 6,518,663 B1 | 2/2003 | James et al. |

* cited by examiner

SINGLE AND MULTIPLE LAYER PACKAGING OF HIGH-SPEED/HIGH-DENSITY ICS

RELATED APPLICATION

The present application is related to another application, entitled CONNECTION PACKAGE FOR HIGH-SPEED INTEGRATED CIRCUIT, Application Ser. No. 09/990,144, filed concurrently on even date, and also assigned to the Assignee of the present invention. The related application is incorporated by reference herein.

FIELD OF THE INVENTION

The present invention relates to packages for high-speed integrated circuits, and more particularly relates to the transmission structures for connecting to high-speed integrated circuit chips for optical/electronic and wired/wireless communications.

BACKGROUND OF THE INVENTION

In optical/electronic and wired/wireless communications, it is increasingly common to communicate using signals with frequencies well into the ranges of a few GHz or tens of GHz. For example, for OC-192/STM-64 optical transmission, the frequency range may be 9 GHz to 14 GHz. For OC-768/STM-256 optical transmission, the frequency range may be, for instance, from 20 GHz to 50 GHz. For the third-generation cellular technology, the frequency range of interest may be between 1.885 GHz and 2.2 GHz and even into 5 GHz with the 802.11 standard. As a result, integrated circuits ("ICs") suited for these high-speed applications are now becoming more in demand than before.

Before these high-speed ICs can be placed onto a printed wiring board ("PWB") or printed circuit board ("PCB"), they need to be packaged either as a single chip, or as a multi-chip module. In addition to providing ease of handling and installation, the primary function of a package is one of dimensional transformation. While at the chip level, the input/output ("I/O") pad size and spacing are in the order of approximately 3 to 5 mils, the same dimensions at the PWB level are typically 10 to 40 mils. At frequencies below 1 GHz, fanning out using short transmission lines can generally accomplish this objective. As the operating frequency of the chip approaches 10 GHz or higher, the task of dimensional transformation needs to be accomplished, while maintaining the characteristic impedance of the overall transmission pathway.

FIG. 1 illustrates a simplified diagram for an exemplary conventional device package. This exemplary package 100 may be a demultiplexing ("demux") device for optical communication, where an input data signal is demultiplexed into multiple lower-speed data signals. This package typically contains a single-layer Alumina ($Al_2O_3$) substrate 110 with a typical thickness of 10 mils, an integrated circuit die 120 residing in a recess 130 formed on the surface of the substrate, and transmission structures 140 on the substrate. The transmission structures, commonly called microstrips, behave preferably like 50-ohm signal transmission lines suitable for high-speed devices. The microstrips are wire-bonded 135 to the signals pads 136 on the die 120, and connected to the lead terminals 150 of the package. For high-speed signals, such as clocks and high-speed data signals to a demux device, the microstrip dimensions are further restrained by how they are connected to the external I/O terminals 150. High-speed signals in the ranges of 20–50 GHz may need to be connected using small coaxial connectors, such as the GPPO connectors manufactured by Gilbert Electronics. These coaxial connectors typically have a 30 mil overall diameter with a 10 mil conductor core. A good microwave transition occurs if the diameter of the conductor core is compatible with the width of the microstrip and the thickness of the substrate 110 matches with the width of the annular ring dieletric ring in the connector. This matching takes place if, for example, a substrate thickness of 10 mils and a microstrip width of 10 mils are selected. On Alumina such a microstrip line has a characteristic impedance of 50 ohms. However, a microstrip of this width cannot be supported at the die side, due to the dimension and location requirements of the signal pads on the die.

To maintain the 50-ohm characteristic impedance, the width of each of the transmission structures 140 needs to be around 10 mils wide for a 10-mil thick Alumina substrate, and the spacing between the transmission structures 140 needs to be at least 10 mils in order to maintain 10% impedance accuracy and minimize cross talk. The constraints on width and spacing of the transmission structures 140 on the substrate limit the density of the signal pads 136 on the die. In this instance, the signal pads cannot be placed closer than 20 mils center-to-center. For low speed or low I/O-count devices, the spacing is typically not a problem because one either does not need to have 50 ohms lines on the package leading to the die or the low I/O count allows sparse spacing of the pads on the die to accommodate the spacing of transmission lines on the package.

For high speed and high I/O-count dies, such a wide pad spacing as dictated by the package is clearly not acceptable. For example, a demux device, such as the one used for OC-768/STM-256 transmissions, may support 16 data signals, or 32 signals when differential signals are utilized. Each of the 32 signals requires a bonding wire connection from the die's signal pad to the substrate and a microstrip connection from the substrate to the lead terminals at the perimeter of the package. As can be appreciated by those skilled in the art, in order to minimize cost, die size is always kept to a minimum thus resulting in limited perimeter allocated for signal pads and the necessary separation between them. Generally it would be desirable to have signal pads that have 3–5 mils center-to-center spacing. If the microstrip is too wide (e.g., 20 mils center-to-center), it encroaches upon its neighboring microstrips, thus forcing others out of alignment with their corresponding signal pads on the die.

Further, the connecting structures for the high-speed signals need to maintain a 50-ohm impedance continuity from the connector to the pad. However, when wire bonds are applied to connect the signal pads to their corresponding microstrips, a discontinuity is created that disrupts the 50-ohm impedance environment, due to the parasitic capacitance in the pads and the parasitic inductance in the wire bonds themselves.

Therefore, while it is desirable to be able to dimensionally transform the width of the high-speed transmission lines from the die side to the package connector side, it is also desirable to be able to maintain the 50-ohm impedance continuity for the connecting structure at all points for the very high frequencies.

The same challenges also confront another version of the connection package, known as Ball Grid Array ("BGA"). BGAs are packages with I/Os dispersed in a two-dimensional rectangular array of solder balls. Such a package is then mounted to the printed wiring board by a solder reflow process. One of the advantages of a BGA package is that with a 2-dimensional I/O array, it can accommodate a large number of I/O signals. However, a BGA package also requires some, if not all, signals to pass through a multi-layer substrate, thus complicating the task of dimensional transformation and impedance continuity.

SUMMARY OF THE INVENTION

Methods and apparatus for packaging high-speed integrated circuits in optical, electronic, wired or wireless communications are disclosed. The connection package achieves dimensional transformation of signal routes from the IC's input/output pads to the external terminals such as coaxial terminals and BGA balls, while maintaining constant characteristic impedance throughout the transmission lines. In accordance with one embodiment of the present invention, the connection package includes a substrate for positioning the IC, microstrips for communicating from the IC's pads to the external terminals. At least a pair of the microstrips, such as the differential signals of the IC, can be positioned closer to each other so that a portion of the differential pair becomes capacitively coupled. Such coupled capacitance allows the width of the differential microstrips to be reduced so that they can accommodate the spacing requirements imposed by the signal pads on the IC. Further, to achieve impedance continuity, a portion of the coupled microstrips near the die is widened to increase the capacitance so that the overall transmission path can become an all-pass network—from the signal pad, through the bonding wires, to the microstrip. For the rest of the portions of the microstrips, they can be tapered and fan out to their respective external connectors.

In accordance with another embodiment of the present invention, a connection package for high-speed integrated circuits with a multi-layer substrate is disclosed. The multi-layer package includes a substrate, at least one coaxial external terminal for communicating a high-speed signal to or from the IC, an array of terminals for communicating lower-speed signals to or from the IC, microstrips formed on the substrate to connect the high-speed signal to the coaxial terminal, microstrips formed on the substrate to connect the lower-speed signals to the array of terminals, and inter-layer connections formed within the substrate. The microstrip for connecting the high-speed signal to the coaxial terminal can have its dimension successfully transformed by controlling its space, and hence the capacitance, to ground planes of the multi-layered substrate. Continuity in the transmission paths can be maintained by maintaining constant characteristic impedance for each segment of the microstrips, inter-layer connections and external terminals.

BRIEF DESCRIPTION OF THE DRAWINGS

FIGS. 9(b)(1) and 9(b)(2) illustrate simplified diagrams of an exemplary via connection for ground connectors from two layers.

DETAILED DESCRIPTION OF THE INVENTION

The present invention provides a connection package for connecting high-speed integrated circuit signals to their external terminals. The package in accordance with the present invention enables the routing of high speed signals using transmission lines from signal pads on integrated circuits to various connectors, including, without limitation, coaxial connectors, BGA connectors, or other surface mount connectors. The design of transmission lines in accordance with the present invention provides necessary dimensional transformation while at the same time maintaining constant characteristic impedance. In the following detailed description, numerous specific details are set forth to provide a full understanding of the present invention. It will be obvious, however, to one ordinarily skilled in the art that the present invention may be practiced without some of these specific details. In other instances, well-known structures and techniques have not been shown in detail so as to avoid unnecessarily obscuring the present invention.

Figure 1:
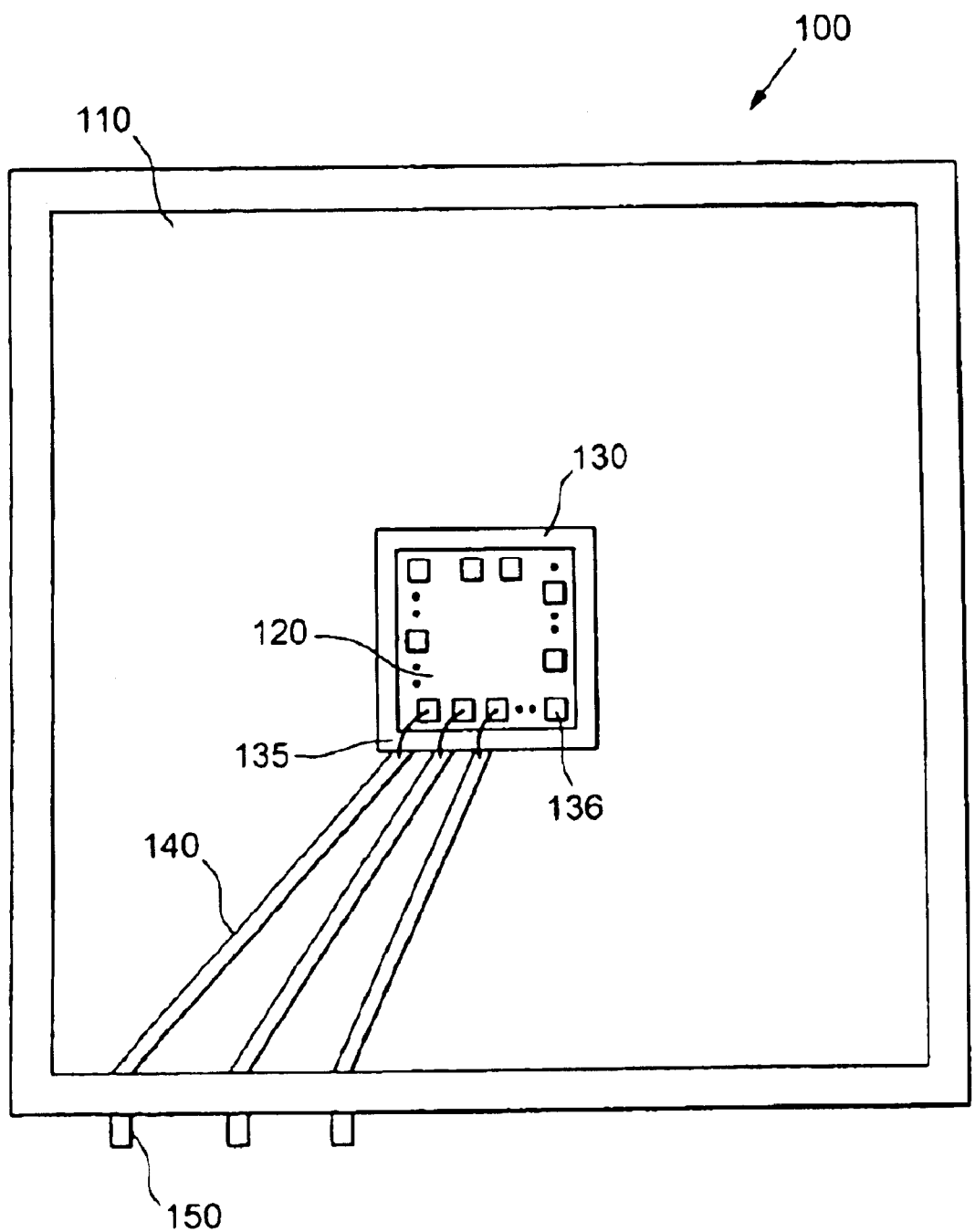
FIG. 1 illustrates a simplified diagram for an exemplary conventional high-speed and high I/O count device package.
Figure 2:
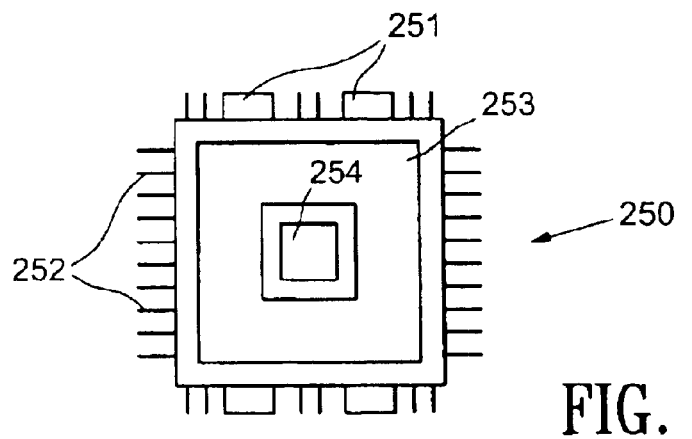
FIG. 2 is a simplified diagram of a package in accordance with one embodiment of the present invention.

FIG. 2 is a simplified diagram of a package (without showing its top cover) in accordance with one embodiment of the present invention. A package 250 includes a substrate 253, an integrated circuit 254, and external connectors. The external connectors may include high-speed connectors 251 that are coaxial connectors (e.g., GPPO, GPO, K-type, V-type, 2.4 mm, SMA, SMB) and lower speed connectors 252 (e.g., 50 ohm feed-throughs). The substrate 253 may include a single layer or multiple layers. A package may include one ore more ICs.

Figure 3A:
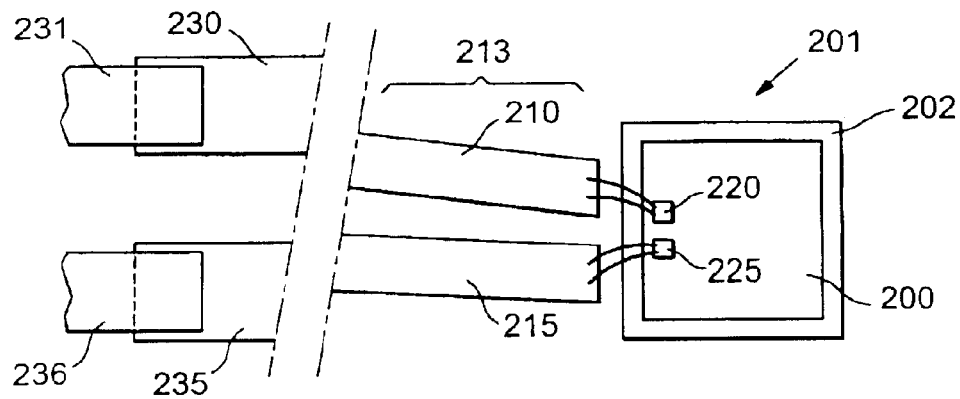
FIG. 3(a) illustrates a simplified diagram of a partial view of an exemplary single-layer substrate with transmission lines for a high-speed integrated circuit.

FIG. 3(a) illustrates a simplified diagram of a partial view of an exemplary single-layer substrate with transmission lines for a high-speed integrated circuit. The high-speed integrated circuit ("IC") 200 is positioned in recess 202 formed typically toward the center of substrate 201. The IC 200 has signal pads 220, 225 at its outer edges. Transmission lines; e.g., microstrips 210, 215, are formed to receive bonding wires from signal pads 220, 225 for transmission to external terminals 230, 235. The microstrips 210, 215 are typically identical in size and shape at the inner edges of the substrate 201 near the signal pads 220, 225 (e.g., area 213). For a high-speed signal connected through a GPPO connector, its width at the connector end of 230, 235 should preferably match the width of the conductor core diameter of the GPPO connectors 231, 236. However, such width, at the IC end, will encroach on neighboring transmission lines, thus limiting the number of transmission lines that can support the signal pads from the IC. However, simply narrowing the width of the transmission line at the IC end will cause impedance discontinuity for the overall transmission path, since a reduction in width results in reduced capacitance to ground, which increases the transmission line's characteristic impedance based on the equation: $Z=1/vC$, where Z is impedance, v is velocity of the signals and C is the capacitance per unit length. To maintain impedance continuity for a typical 50-ohm transmission line, the capacitance must be compensated by some other means. In accordance with one embodiment of the present invention, the thickness of the substrate 201 is substantially identical to the width of the dielectric "ring" portion of the cylindrical GPPO connectors 231, 236. This provides a smooth transition between the ground plane at the bottom of the substrate and the ground connection located at the outer cylinder portion of the GPPO connectors. It should be noted that the term "microstrip," "transmission line," "stripline," or the like is used to describe or claim either a signal path or a power or ground path. It may have various shapes, including, without limitation, lines or no particular patterns (e.g., FIGS. 12(d), (h)).

Figure 3B:
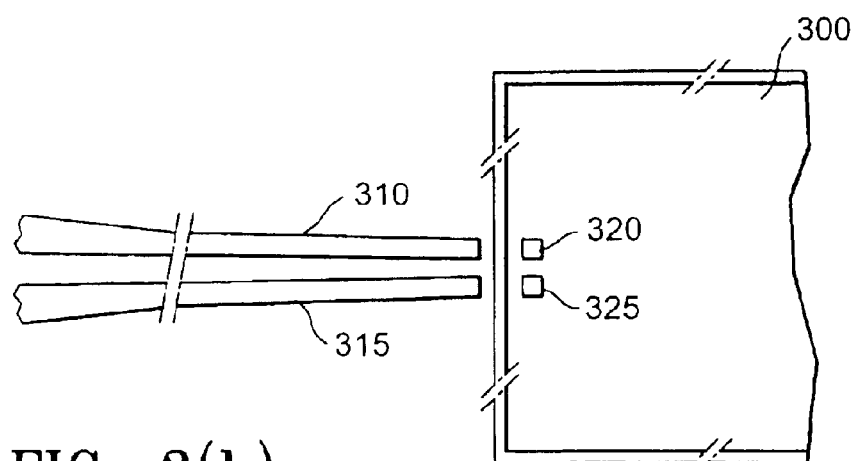
FIG. 3(b) illustrates a simplified diagram of an exemplary partial view of a single-layer substrate with transmission lines 310, 315 and signal pads 320, 325 in accordance with one embodiment of the present invention.

FIG. 3(b) illustrates a simplified diagram of an exemplary partial view of a single-layer substrate with transmission lines 310, 315 and signal pads 320, 325 in accordance with one embodiment of the present invention. As can be appreciated by those skilled in the art, for high-speed integrated circuits, many high-speed signals are implemented as differential lines, i.e., a signal and its complement. For an exemplary high-speed demux, input data and clock signals may be preferably implemented as differential signals data/datan and clock/clockn, respectively. For an exemplary high-speed mux, output data and clock signals may be implemented as differential signals, as well. The width of each of the transmission lines 310, 315 may match the width of the corresponding signal pads 320, 325 in accordance with one embodiment of the present invention.

Figure 4A:
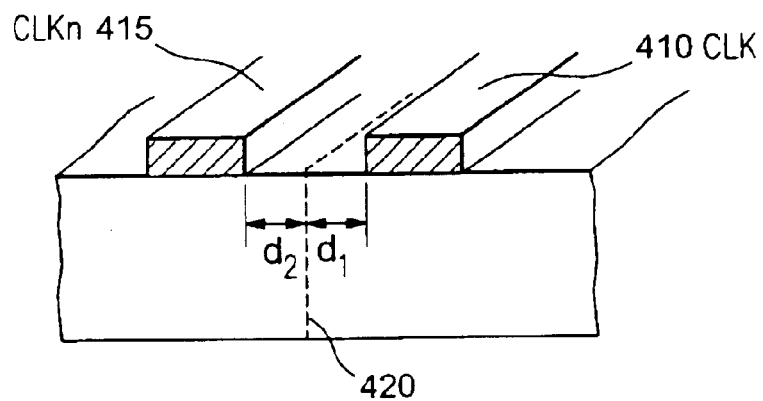
FIG. 4 illustrates a simplified diagram of an exemplary cross-coupled differential signal strips in accordance with one embodiment of the present invention.
Figure 4B:
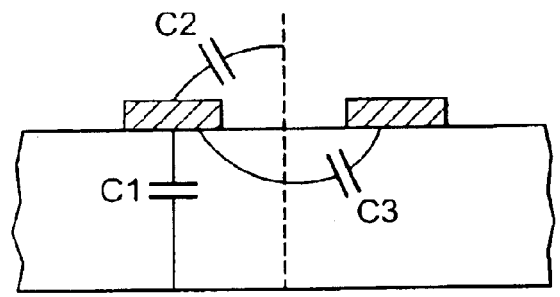

In accordance with one embodiment of the present invention, when high-speed signals are implemented as differential signal lines, a virtual ground is created between the differential signals, as shown in FIG. 4(a). A virtual ground plane 420 is created in the middle, since the signals on microstrips 410 and 415 on both sides of virtual ground plane 420 are equal in magnitude but opposite in polarity. Plane 420 is a vertical dissecting plane. The distance (d1) between microstrip 410 and the virtual ground 420 and the distance (d2) between microstrip 415 and the virtual ground are equal all along the length of the microstrips 410 and 415. Therefore by the principle of symmetry plane 420 will necessarily be at ground potential hence a virtual ground. Bringing the lines closer together increases the capacitance of each line to the virtual ground plane. Because of this added capacitance, the width of the signal lines can thus be reduced while maintaining the signal lines' constant characteristic impedance. Microstrip 410 for clock, for example, is positioned closer to microstrip 415 for clockn, so that microstrips 410 and 415 pick up capacitance to the virtual ground plane. Such capacitance can compensate the loss in capacitance to the bottom ground plane due to reduced line width thus resulting in unchanged characteristic impedance for each signal line. An equivalent circuit of the diagram of FIG. 4(a) is shown in FIG. 4(b). Here, the overall capacitance, C, of each signal line to ground can be expressed as $C=C1+C2$. Therefore, the reduction in capacitance C1 due to the narrowed microstrip width can be compensated by the increase in capacitance C2 to the virtual ground when the differential lines are brought closer together. The dependence of C2 on the separation between 410 and 415 becomes apparent from the following: $C2=2\times C3$ where C3 is the coupling capacitance between the differential lines 410 and 415.

It should be pointed out that for a given characteristic impedance, the width and separation of the differential microstrips also depend on, among others, the following factors: the dielectric constant of the material and thickness of the substrate. Table 1 illustrates various exemplary width and line spacing combinations for microstrips in high-speed applications on an Alumina substrate, where the thickness is the thickness of the substrate, width is the width of each of the microstrips, and spacing is the spacing between the microstrips. For example, if the spacing is brought down to 3 mils, the width of each of the microstrips can be reduced to about 3 mils.

TABLE 1

Parameters for 50 ohm coupled microstrip on Alumina (impedance in ohms, dimensions in mils)

| Impedance | 50 | 50 | 50 | 50 | 50 | 50 | 50 | 50 |
|---|---|---|---|---|---|---|---|---|
| Thickness | 10 | 10 | 10 | 10 | 10 | 10 | 10 | 10 |
| Width | 9.7 | 9.3 | 8.4 | 6.8 | 4.5 | 3.0 | 2.1 | 1.1 |
| Spacing | 80 | 50 | 20 | 10 | 5 | 3 | 2 | 1 |

As illustrated by the table, the closer the microstrips are positioned, the narrower they can be. Also, only a partial length of the differential microstrips from the IC end are tightly coupled, while the rest of the microstrips can fan out to their desired width, as spacing becomes more available toward the outer edges of the substrate. For example as spacing grows beyond 20 mils, the line width ceases to grow appreciably. Of course, the precise placement and width of microstrips can be implemented by computer-aided design tools, one of which is a microwave design software Agilent EEsof ADS available from Agilent, 395 Page Mill Rd., Palo Alto, Calif. 94303. Reducing the width and spacing of the microstrips at the inner edges of the substrate near an IC will reduce the width and spacing of the signal pads on the IC, allowing more I/O pads to be placed on a die. For example, if the microstrips are 2 mils in width and 2 mils in spacing, the signal pads can also be 3 mils in width and 1 mil in spacing.

Figure 5:
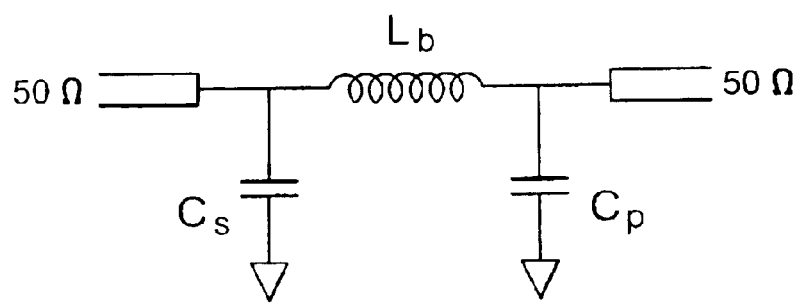
FIG. 5 illustrates an exemplary equivalent circuit diagram of an all-pass CLC network.

While the microstrips of the differential signals can be narrowed by the capacitive coupling effect, the overall impedance of the whole transmission path must be maintained and continued, even after bonding wires are attached between the signal pads and the microstrips. As shown in FIG. 5, an exemplary transmission path from the signal pad, through the bonding wires, to the microstrip needs to be an all-pass network, or commonly called a "CLC network," where the pad has a capacitance of $C_p$, the bonding wires have an inductance of $L_b$, and the microstrip has a capacitance of $C_s$. The bonding wires can be one or more wires per pad, and they may be ribbon bonds. Having multiple wires per pad or ribbon bonds may reduce inductance.

Figure 6:
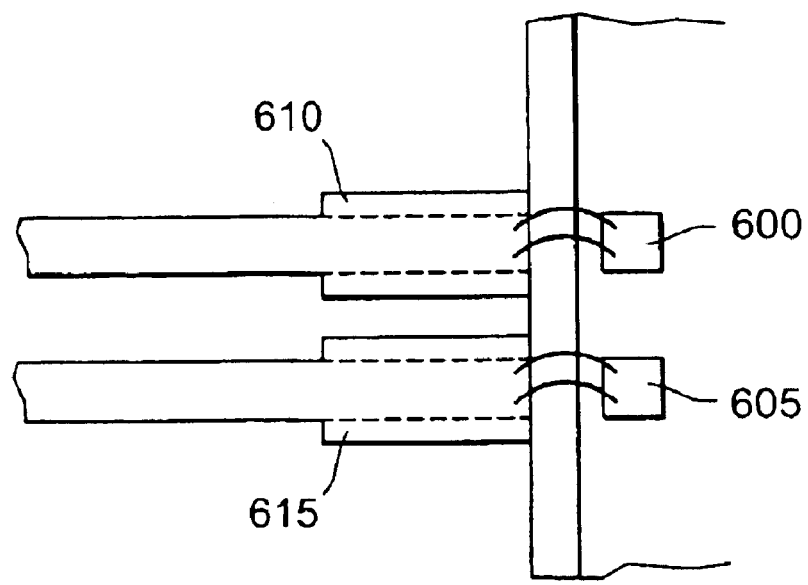
FIG. 6 illustrates a simplified diagram of an exemplary pair of differential signals in accordance with one embodiment of the present invention.

As can be appreciated by those skilled in the art, for a CLC network, the impedance is determined by: $Z=\sqrt{(L/C)}$, where $C=C_p+C_s$. To maintain the characteristic impedance Z at, say, 50 ohm, as is the case for a high-speed transmission path, with L=0.170 nH contributed from the bonding wires, the value of C needs to be around 70 fF. If the capacitance $C_p$, from the signal pad is about 35 fF, $C_s$ from the microstrip needs to be 35 fF. To achieve such additional required capacitance, or any required value under different circumstances, the width of a portion 610, 615 of the microstrips can be increased, as shown in FIG. 6, to achieve the desired effective value of 35 if. The widened portion 610, 615 is located near the signal pads 600, 605 in an area that receives the bonding wires. The size and shape of the portion 610, 615 are typically identical. The precise amount of widening, as well as its extent lengthwise, can be readily computed using the aforementioned microwave design tool. In FIG. 6, while the portion 610, 615 is rectangularly shaped, it is not limited to that shape and may have other shapes. Also, while portion 610, 516 is symmetrically situated along each of the microstrips, it may not be symmetrical in other embodiments.

Therefore, a single-layer substrate connection package for a high speed IC has been disclosed. The microstrips for the differential signals are positioned closer such that a portion of the microstrips becomes capacitively coupled. Such coupled capacitance allows the width of the differential microstrips to be reduced so that they can readily accommodate the spacing requirements imposed by the signal pads on the IC. Further, to achieve impedance continuity, a portion of the coupled microstrips near the die is widened to increase the capacitance so that the overall transmission path can become an all-pass network—from the signal pad, through the bonding wires, to the microstrip. For the rest of the portions of the microstrips, they can be tapered and fan out to their respective external connectors.

While packages using single-layer substrates are more economical and can achieve faster turnaround time, those using multiple-layer substrates have become popular because they are more amenable to PWB mounting for high speed optical/electronic and wired/wireless applications, as well as take up much less physical dimension in comparison with a single layer 2-dimensional only package. In the background description, the tasks of achieving dimensional transformation and maintaining constant characteristic impedance also challenge those designing connection packages with multi-layer substrates for high-speed ICs. In the following description, a novel connection package will be described for routing high-speed signals using transmission lines from the signal pads on the IC to the BGA balls, as well as to coaxial connectors mounted on the side of such BGA package. Preferably, signals around or below the 2.5 Gbps range are routed to the BGA balls, while signals in the range of 40 Gbps are routed to the coaxial connectors on the side of the package. This is done because coaxial connectors provide better controlled-impedance connections than the balls and because the routing to connectors has less impedance discontinuities, which tend to distort high frequency signals.

Figure 7:
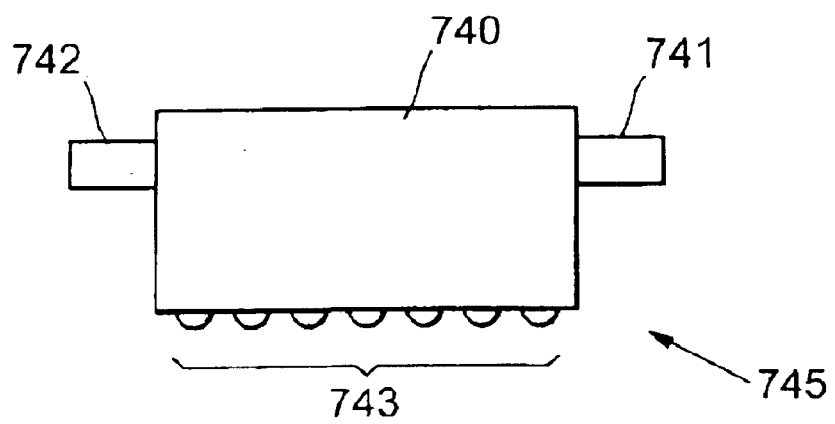
FIG. 7 illustrates a simplified diagram of an exemplary multi-layer package in accordance with one embodiment of the present invention.

FIG. 7 shows a simplified side view diagram of an exemplary multi-layer package in accordance with one embodiment of the present invention. A package 745 may include one or more ICs (not shown), a multi-layer (not shown) substrate 740, high speed connectors 741, 742, e.g., coaxial connectors such as GPPO, GPO, etc., and low-speed connectors 743, e.g., BGA, surface mount pins, etc. In another embodiment, the package 740 may be a single-layer substrate. In FIG. 7, while the high-speed connectors are located at the side of the package 745, they may be located at other locations of the package 745 in other embodiments. Also, while the low speed connectors 743 are located at the bottom of the package 745 in FIG. 7, they may be located at other locations of the package 745 in other embodiments.

As is well known in the art, a multi-layer ceramic substrate is typically formed by laminating multiple layers of ceramic dielectric materials together. A thin metal layer is typically sandwiched in between two dielectric layers patterned to form the connection or routing circuit, where the pattern is either photo-lithographically defined or silk-screened onto the dielectric layer. In one embodiment, each single dielectric layer has a thickness of about 4.4 mils and two layers are used to achieve an overall thickness of about 8.8 mils. Ground connections can be formed at the top surface of the substrate, in-between layers, or at the bottom surface of the substrate. To form a multi-layer substrate, all the layers, after having metal patterns applied onto them, are laminated together by pressing in a hydraulic pressure chamber. Then it is co-fired in a furnace to eventually form a monolithic sheet of substrate. Currently, there are process for low-temperature co-fired ceramics ("LTCC") and high-temperature co-fired ceramics ("HTCC"). The monolithic sheet, typically 6-inch by 6-inch in dimension, can then be cut into individual packages for die attachment. In contrast, a conventional printed circuit board ("PCB") has multiple layers, which are laminated together after the metal connection patterns are defined by chemical etching of each layer. The resolution of connection lines that can be achieved by a conventional PCB is generally too coarse for the fine line geometry required for bonding to tightly spaced pads in high I/O count integrated circuits. Therefore, a multiple-layer substrate can facilitate different ground planes to be designed, allowing different thicknesses for the dielectric materials under the transmission lines. For a high speed, high I/O count device, e.g., a multiplexor for OC-768 applications, there may be as many as 17 layers in a multi-layered substrate (an example is to be shown in connection with FIG. 12)

Figure 8:
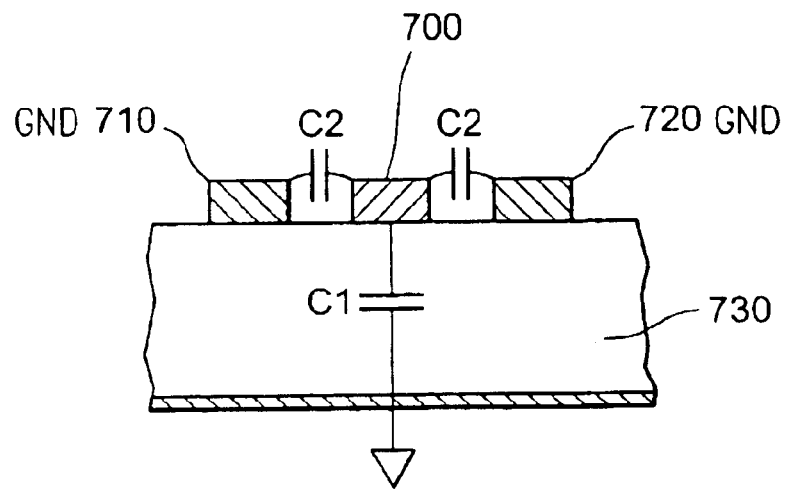
FIG. 8 illustrates a simplified cross-sectional diagram of an exemplary microstrip on the substrate at the end adjacent the IC in accordance with one aspect of the present invention.

FIG. 8 illustrates a simplified cross-sectional view of an exemplary microstrip 700 on the substrate, as viewed from the IC, in accordance with one aspect of the present invention. Microstrip 700 is a transmission line and strips 710, 720 are co-planar ground connections. At this end, the width of the microstrips is limited due to the density of signal lines, as in the case of the aforementioned single-layer substrate. Therefore, the ground plane is preferably placed as close to the microstrip 700 as possible so that the width can be narrowed. For a multiple-layer substrate, the closest ground plane can be implemented at the bottom of the top layer. To achieve the required capacitance, the microstrip 700 and its co-planar ground strips 710, 720 are closely positioned so that they become capacitively coupled. The effective capacitance thus becomes $C=C1+2\times C2$, where C1 is the capacitance between microstrip 700 and ground plane at the bottom of the substrate and C2 is the capacitance between microstrip 700 and one of the co-planar ground strips 710, 720. C2 plays the same role as in FIG. 4(b) allowing the width of line 700 to be minimized to accommodate dense IC pads placement.

At the other end of microstrip 700, however, more width of microstrip 700 is required to match with the diameter of a coax connector signal pin. Unfortunately the line widening tends to increase the capacitance to ground. Therefore in order to maintain constant impedance as before, the ground plane has to be brought further down to lower layers of the substrate as the signal line is widened. Simultaneous line widening and ground plane lowering keep the capacitance of the signal line constant. Consequently constant characteristic impedance is maintained. If two layers are used, then the ground plane at the connector's end can be at the bottom of the second layer. In short, a multiple-layer substrate allows transition in ground planes. Signal line widening in conjunction with such ground plane transition makes it possible to achieve dimensional transformation while maintaining constant signal line characteristic impedance.

Figure 9A:
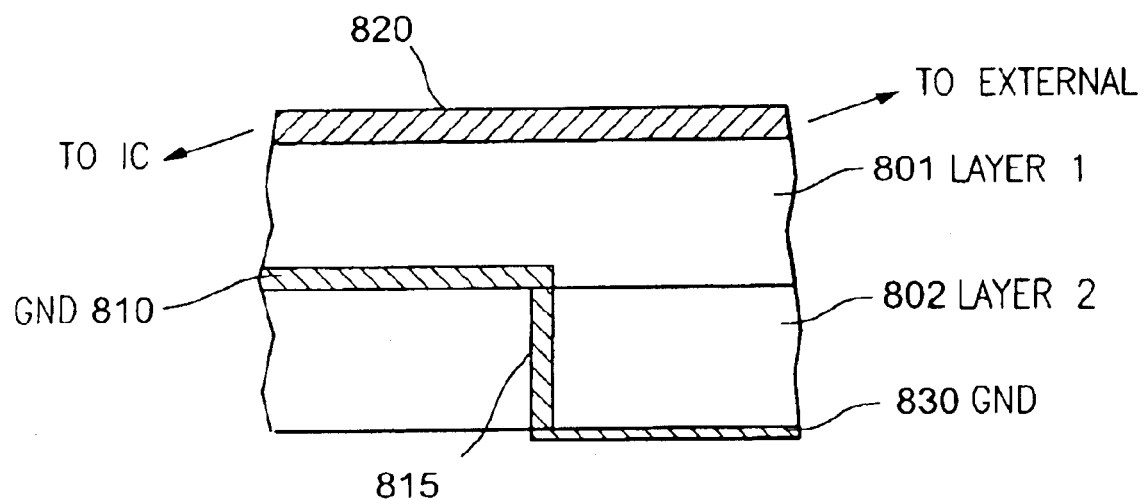
FIG. 9(a) illustrates a simplified diagram of an exemplary ground connection transitioning from one layer to another layer in accordance with one embodiment of the present invention.

FIG. 9(*a*) illustrates a simplified diagram of an exemplary ground connection transitioning from one layer to another layer in accordance with one embodiment of the present invention. From the IC's end, the ground plane 810 is in-between the first layer 801 and the second layer 802. At the external connector's end, the ground plane 830 is at the bottom of the second layer 802. A via connection 815 is made to connect ground 810 to ground 830 through the second layer 802. Such transition is an abrupt transition, which is normally undesirable for high-speed application. To avoid creating a discontinuity at this junction, at least one of the ground via connections is being placed directly underneath the signal microstrip 820 (as further shown in FIGS. 9(*b*)(1) and 9(*b*)(2)), so that the return ground current will not take a circuitous path. The microstrip 820 may carry a high-speed signal to be connected to a coaxial connector, or a lower speed signal to be connected to the external lead terminal. If the dimensions of the connector pin and the dielectric ring require three or more layers of separation between 820 and 830, the ground plane transition and line widening process can be repeated.

FIGS. 9(*b*)(1) and 9(*b*)(2) illustrate simplified diagrams of an exemplary via connection for ground connectors of a multi-layer substrate. Microstrip 910, which may be a high-speed signal or a lower-speed signal, is formed on top of first layer 915 of dielectric material for transmission. First ground plane connection 930, which is formed on top of second layer 920 but below first layer 915, is closer to microstrip 910 than a second ground plane connection 950 is to microstrip 910, thus allowing microstrip 910 to have smaller geometry while it is located above the first ground connection 930. Via connection 940 provides an abrupt transition from first ground plane connection 930 to second ground plane connection 950. Second ground plane connection 950 is formed at the bottom of second layer 920, thus providing a thicker dielectric material underneath microstrip 910.

As can be appreciated by those skilled in the art, because of the different distances (i.e., thickness) between ground connections 930, 950, and microstrip 910, the width of microstrip 910 needs to be widened to maintain a constant impedance structure, i.e., tapering out as the ground plane is further away. Such tapering out of microstrip width, from the IC's end to the connector's end, makes dimensional transformation more achievable and with better results. FIG. 9(*b*)(2) shows a top-down view of an exemplary tapering structure of microstrip 910. Microstrip 910 is narrow over the ground plane connection 930 and wider over the ground plane connection 950. The tapering occurs over the via connection 940. Although a substrate of only two layers is illustrated, it should be apparent to those skilled in the art that additional layers may be implemented to take advantage of the variable ground plane approach. While FIGS. 9(*a*), 9(*b*)(1) and 9(*b*)(2) have been illustrated using ground plane connections, similar illustrations can be shown using power plane connections if the signal ground has non-zero DC potential.

FIG. 10(*a*) illustrates a simplified diagram of an exemplary microstrip being connected to a BGA ball in a multi-layered substrate. For a BGA package, microstrip 1000 is routed from the IC's end to an external BGA ball 1050 at the bottom of the package. Microstrip 1000 is routed to coaxial connector 1030, and then to internal stripline 1035, which is further routed to coaxial connector 1040 and then to BGA ball contact 1050. The "vertical" or z-axis, connectors 1030, 1040 are considered "coaxial" because they are essentially a high speed signal line in the form of metal vias going through the center of a generally cylindrical tube of dielectric material surrounded by "washer-like" ground plane openings on each layer as the layers are stacked up.

In addition to wire or ribbon bond connections, the single-layer or multiple-layer approach can also be applicable to other connections to the IC with high I/O count, such as flip chip connections. For flip chip connections, signal pads are directly connected to the microstrip by flipping the IC over and positioning it above the strip for connection by solder balls.

Referring to FIGS. 10(*a*) and (*b*), first ground connection 1060 may be formed at one layer and connected to ground connection 1080 at the bottom of the package through via connection 1070 to provide ground for BGA contact 1050. Another ground connection 1010 may be routed to ground connection 1020 at another layer through via connection 1015. This ground connection 1020 may further be routed to the bottom layer to provide a ground for BGA contact 1050. Other ground connections may be routed through via connections (shown in dashed lines in FIG. 10(*a*)) surrounding internal stripline 1035, also shown in FIG. 10(*b*). The signal stripline (e.g., 1035) is surrounded by two ground planes (e.g., 1020, 1080) above and below. The two ground planes are connected to each other by vias (e.g., 1022, 1024) as shown in FIGS. 10(*a*) and (*b*). The spacing (e.g., d10, which is the distance between a center of a via and a center of another via as shown in FIG. 10(*c*)) of the vias along the direction of signal flow should be a fraction (e.g., 1/10) of the wavelength of the highest frequency signal that goes through the stripline. The spacing (e.g., d11, d12, which is the distance between an edge of a via and an edge of a stripline as shown in FIG. 10(*d*).) between a via (e.g., 1022, 1024) and the signal line (e.g., 1035) should be about half of the separation (e.g., d13, which is the distance between edges of two ground planes as shown in FIG. 10(*e*)) between the two ground planes. It should be noted that for a multi-layered substrate, a conduction path for either the signal or the ground connection may be achieved by successive horizontal and vertical connections, as required by the design.

Exemplary paths for a lower speed differential signal (e.g., 2.5 GHz) may be described as follows. A lower speed differential signal, which is not routed to GPPO connectors, may begin as a differentially coupled microstrip pair as described previously in Table 1. As it moves away from the IC's end, the two lines in the pair begin to taper out and capacitively decouple from each other. They separate into two single-ended microstrips. To bring each one of the decoupled microstrip toward the BGA connector at the bottom of the package, it is routed to lower layers through a combination of vertical coaxial connectors and horizontal internal striplines. Finally, it reaches its designated BGA connector location through a last coaxial connector.

As with the aforementioned single-layer connection package, the connection package with multi-layer substrates should also address its characteristic impedance. That is, the impedance of a whole signal line structure from the IC end to either the BGA ball, or the GPPO connector, should be preferably of given impedance, e.g., 50 ohms. In the case of a high-frequency signal to GPPO, the signal line is kept simple by having only one coupled microstrip for a single-layer package, or one tapered co-planar line for a multi-layer package in accordance with exemplary embodiments of the present invention. For the high-frequency signals, it is desirable to keep the signal line simple because transitions between different types of 50-ohm lines create discontinuities. Discontinuities create problems that are more serious for high frequencies than for low frequencies. Also, GPPO is used for high frequency signals because the BGA balls are themselves a discontinuity. The discontinuity created at the transition between the signal line on the substrate and the GPPO connector is mitigated by matching the line width of the signal line and the dielectric thickness of the substrate. There is another discontinuity at the pad/wire bond. A CLC network (as described with reference to FIG. 5) can be used to mitigate that discontinuity, for both single- and the multi-layer packages.

In the case of low frequencies, e.g., 2.5 Gbps, using GPPO connectors may not be as practical because there are too many low frequency signals. In accordance with one embodiment of the present invention, BGA balls can be used, which are less expensive and packed more densely. To route to the BGA balls, the signal path has to transition from microstrips to internal "coaxial" connectors to striplines to other internal "coaxial" connectors and finally to balls. Each of the lines (i.e., microstrips, coaxial connectors, and striplines) is designed as a 50-ohm line. The design is done by controlling the width of the line and its distance to the ground plane so that the capacitance to ground is what is needed to obtain 50 ohms (based on Z=1/Cv, where C is capacitance and v is voltage). The discontinuities created in the transitions from one line to another are more tolerable for low frequencies. To minimize the effect of discontinuity of the ball, lines are narrowed on the PWB as a way to "tune out" the discontinuity.

In the case of the very low frequency signals such as the control signals (typically at 10 Mbps), the lines can be routed without as much regard to their impedances.

Figure 11:
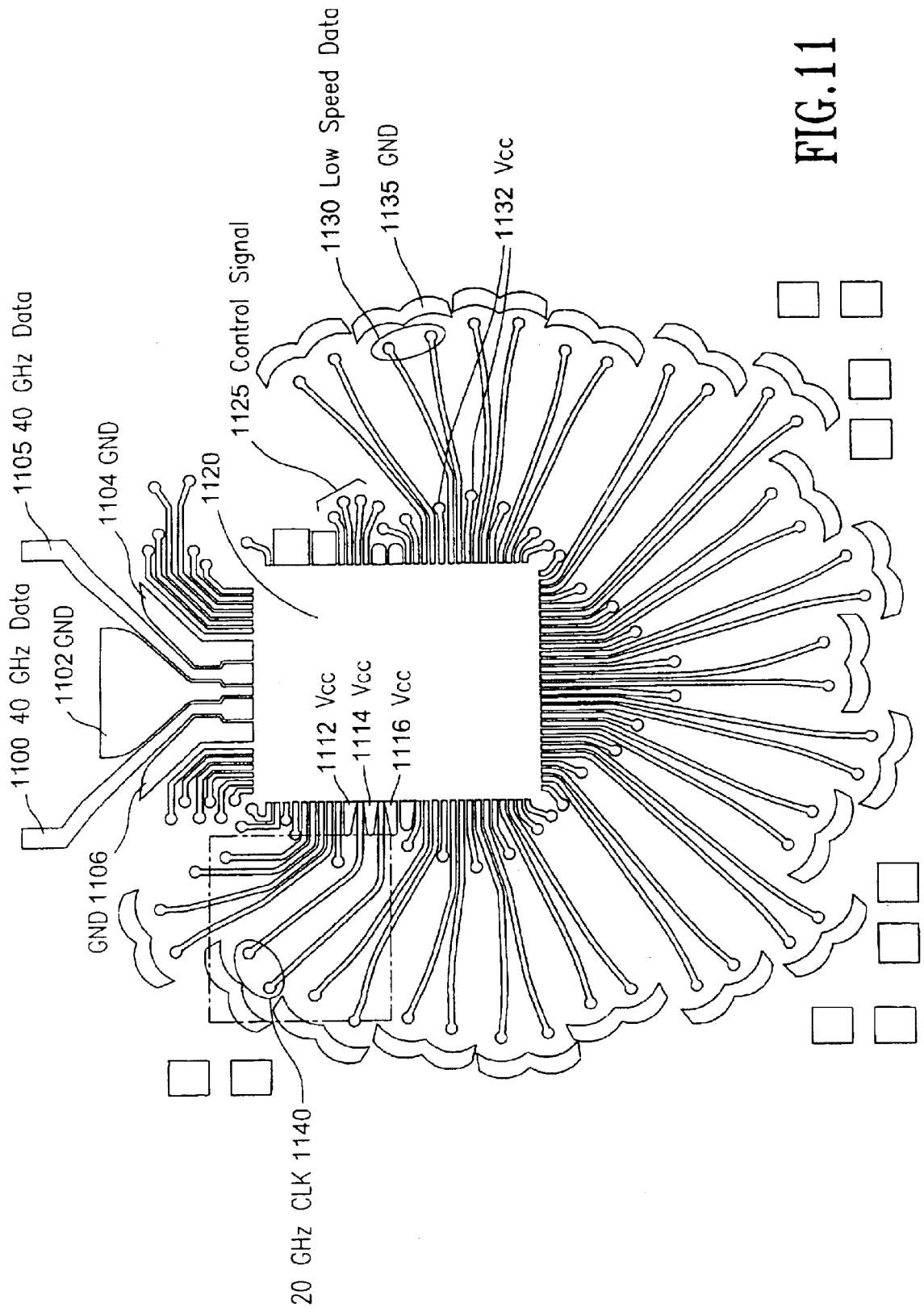
FIG. 11 illustrates a layout for a top layer of an exemplary connection package with BGA and coaxial connectors for an OC-768 multiplexor device in accordance with one embodiment of the present invention.

FIG. 11 illustrates an exemplary top layer for a connection package with BGA and GPPO connectors for an OC-768 multiplexor device in accordance with one embodiment of the present invention. Microstrips 1100, 1105 are for 40-GHz high-speed signals such as data signals. They are connected to coaxial connectors, e.g., GPPO connectors, mounted on the side of the device. The microstrips 1100, 1105 are flanked with co-planar ground strips 1102, 1104, 1106 on both sides of the high-speed signals. While FIG. 11 shows high-speed signals surrounded by co-planar ground strips, high-speed signals may be connected as shown in FIGS. 3(a)-6.

Strips 1125 are used as control lines, such as error_out, error_reset, channel_0 and next_channel signals, which "disappear" from this top layer as they are routed through via connections down to the BGA balls at the bottom (not shown). The very low-speed nature of these signals means that their routing does not need to be treated with as much care to maintain constant characteristic line impedance.

Figure 10A:
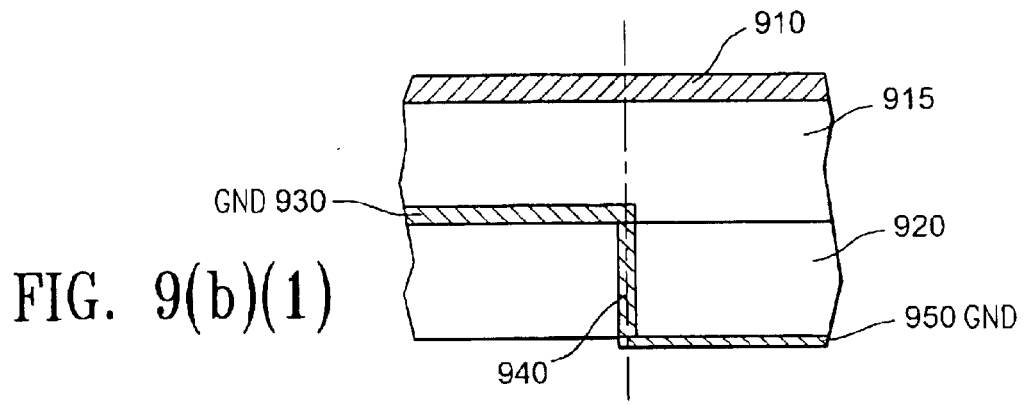
FIG. 10(a) illustrates a simplified diagram of an exemplary microstrip being connected to a BGA ball.
Figure 10A:
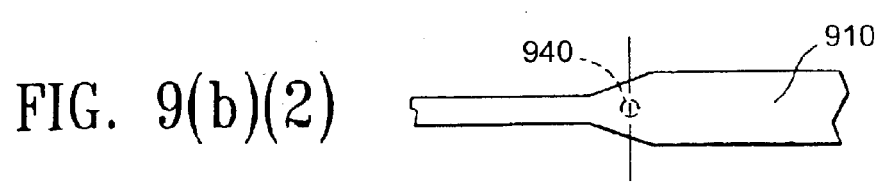
Figure 10A:
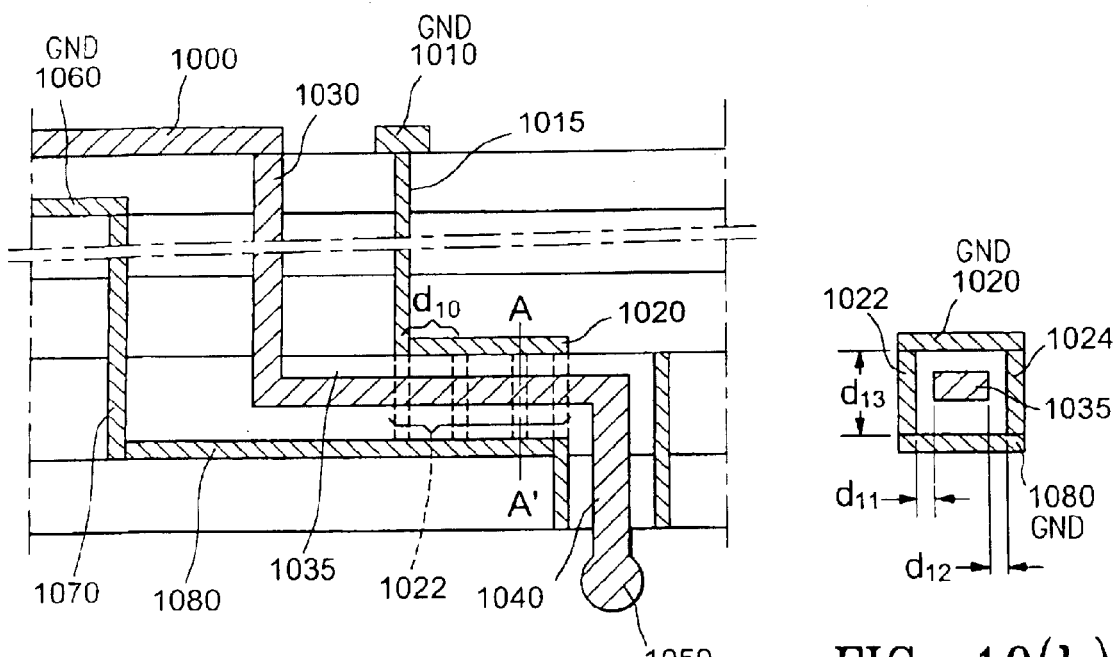
Figure 10B:
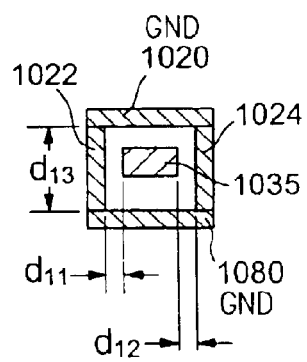
FIG. 10(b) illustrates a simplified cross-sectional view of an exemplary stripline along an axis A–A' of FIG. 10(a) in accordance with one embodiment of the present invention.
Figure 10C:
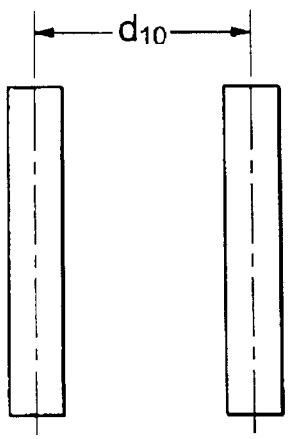
FIG. 10(c) illustrates a distance "$d_{10}$" between two via connections.
Figure 10D:
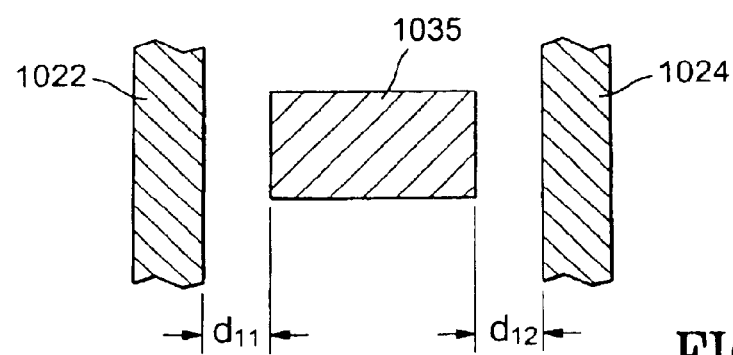
FIG. 10(d) illustrates a distance "$d_{11}$" between the edges of a via connection and of a stripline and a distance "$d_{12}$" between the edges of a via connection and of a stripline.
Figure 10E:
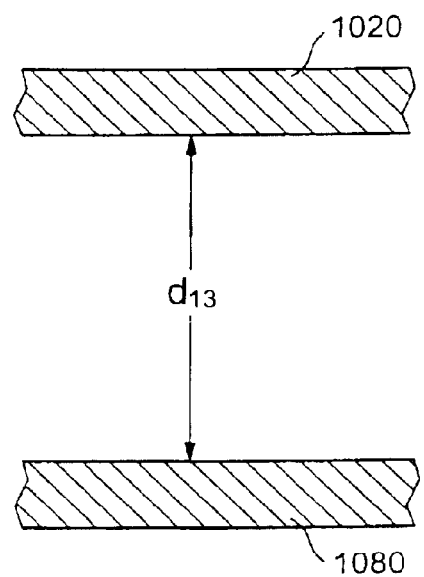
FIG. 10(e) illustrates a distance "$d_{13}$" between the edges of two ground planes.

Microstrips 1130, which are used for lower-speed data signals, extend further out before they also disappear as they are routed to the BGA balls at the bottom (not shown) through a combination of coaxial (vertical) and internal stripline (horizontal) connections. Shown on the side of the signal microstrips 1130 are power signals 1132, such as Vcc and Vdd, which also make their way to the bottom layer through successive vertical and horizontal connections through the substrate. The "wing-shaped" strip 1135 provides ground for the microstrips 1130 to coaxial transition (as shown in FIG. 10(a)). Microstrips 1140, flanked by Vcc strips 1112, 1114, 1116, are used as 20-GHz clock signals in one of the current embodiments. They are routed to the lower layers to be terminated by BGA connectors, as will be shown in connection with FIGS. 12(a)–(q).

Figure 12A:
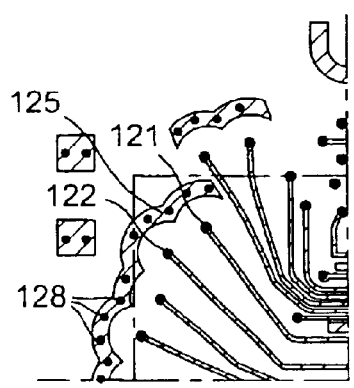
FIGS. 12(a)–(q) illustrate an exemplary routing of a pair of clock signals through the multi-layered substrate in accordance with one embodiment of the present invention.
Figure 12B:
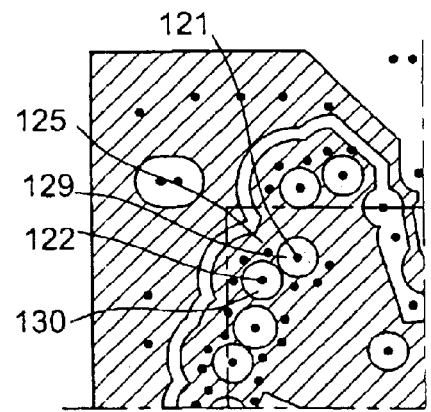
Figure 12C:
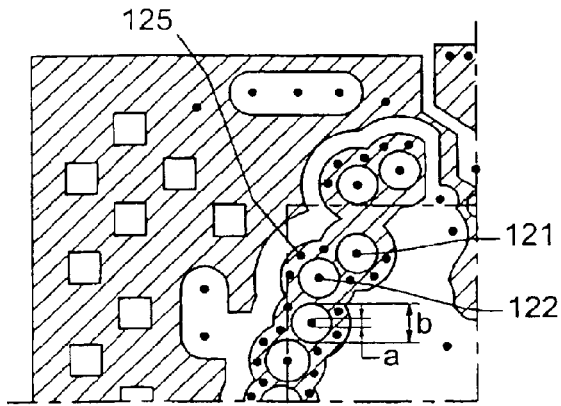
Figure 12D:
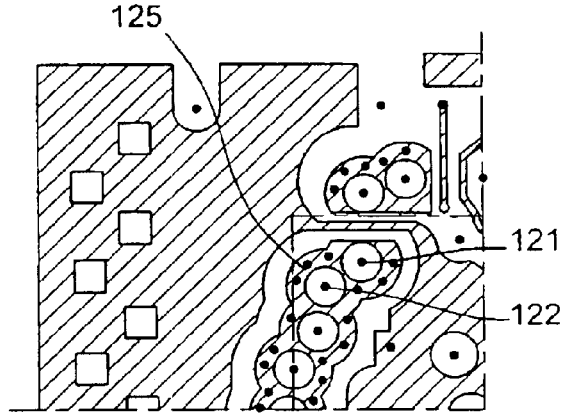
Figure 12E:
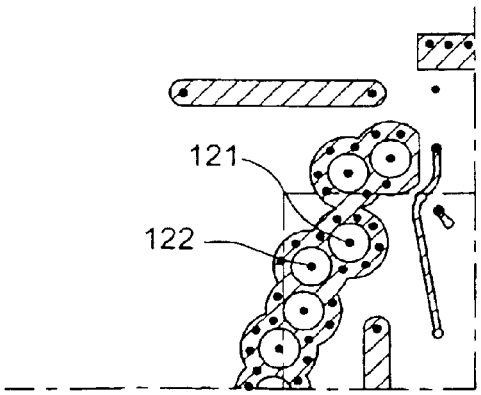
Figure 12F:
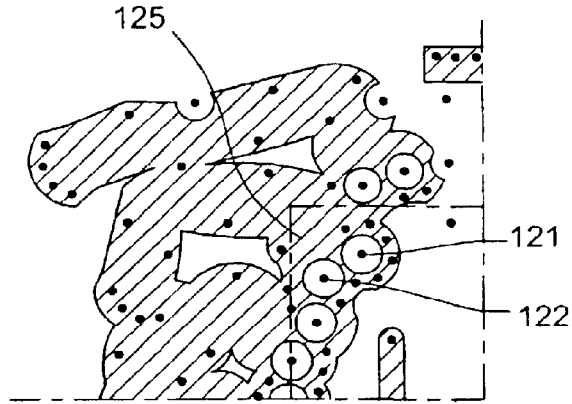
Figure 12G:
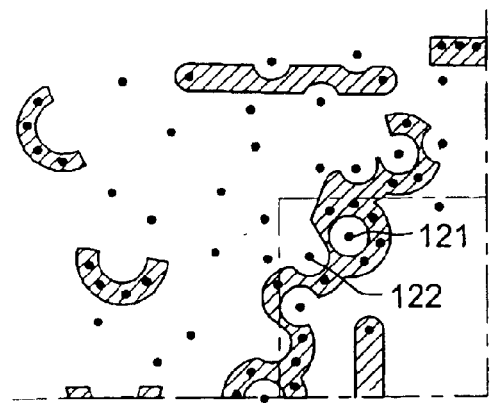
Figure 12H:
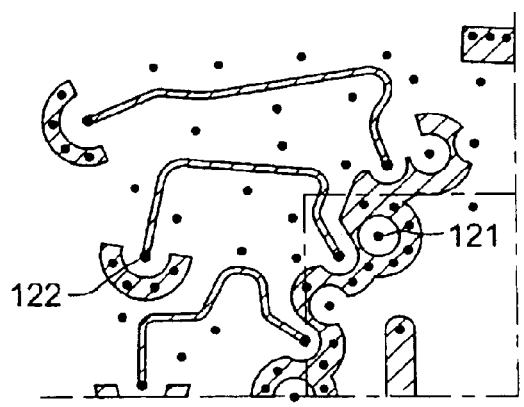
Figure 12I:
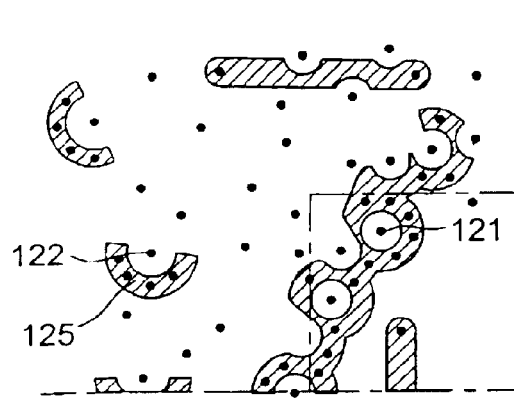
Figure 12J:
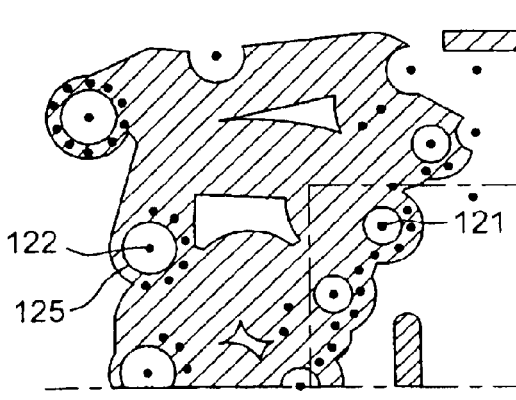
Figure 12K:
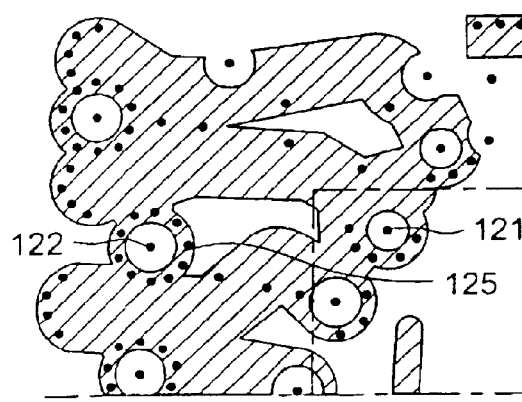
Figure 12L:
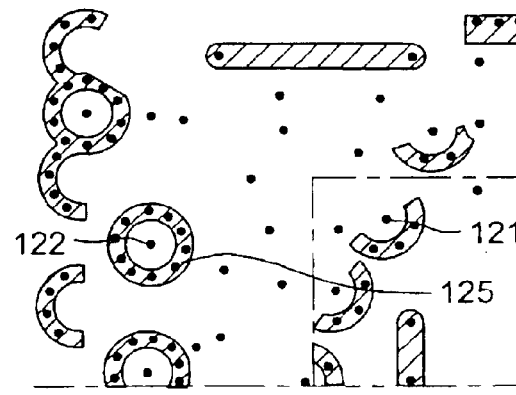
Figure 12M:
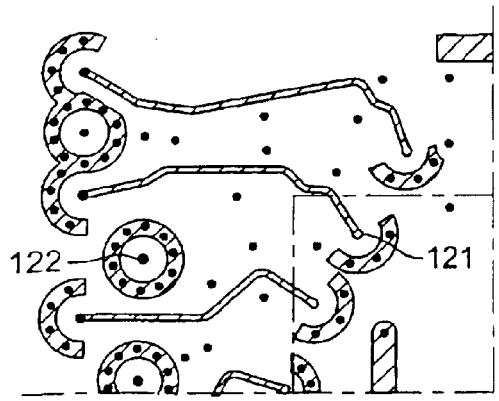
Figure 12N:
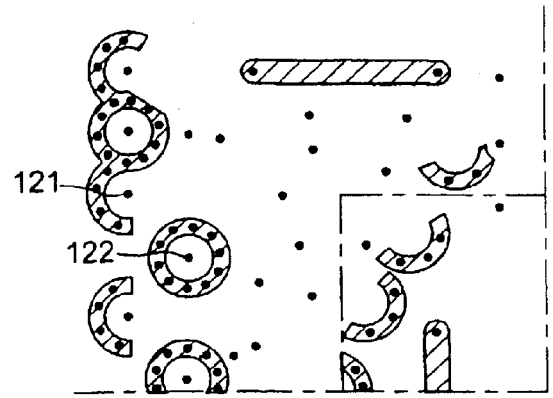
Figure 12O:
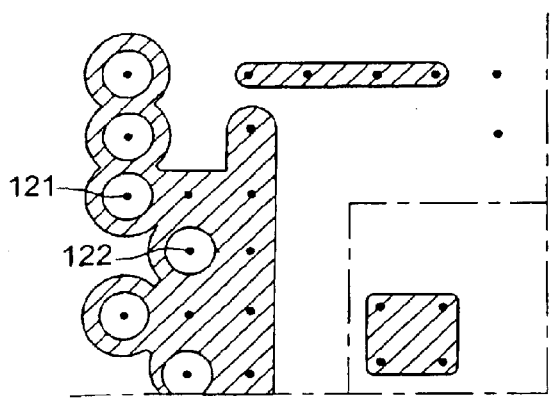
Figure 12P:
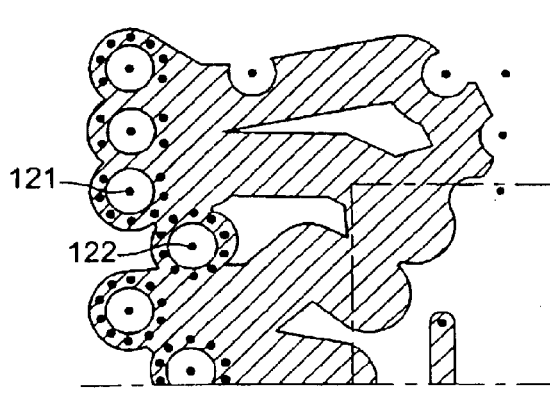
Figure 12Q:
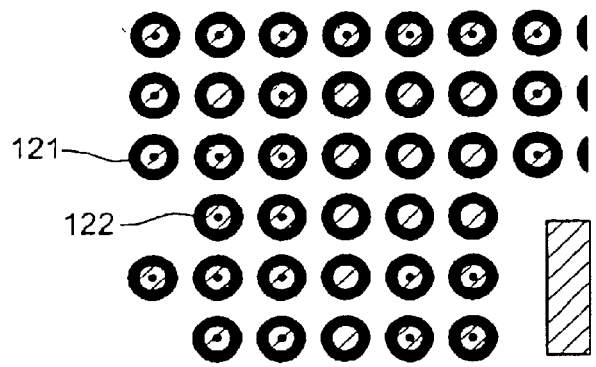

FIGS. 12(a)–(q) illustrate an exemplary routing of microstrip signals 121, 122 (shown inside the reference box in FIG. 11) through the layers to their BGA connectors. Depending on the location of the signal connections, the number of layers in a multi-layered substrate and the location of the BGA connectors, those skilled in the art may route their signals in a way that is quite different from what are illustrated in FIG. 12. Therefore, the routing shown in FIG. 12 should be understood for their illustrative purposes only.

FIG. 12(a) is an exemplary Layer 1. After leading out from the IC end, signals 121, 122 disappear from Layer 1 and are routed to Layer 2 through the via connectors (shown as darkened dots) at the end of the microstrips. The "wing-shaped" island 125 is ground, with via connections (darkened dots e.g., 128) also leading to lower layers.

FIG. 12(b) is an exemplary Layer 2. Vertical connections are implemented for signals 121, 122, which are extending further down to the lower layers (moving in the z-axis direction). Signals 121, 122 are surrounded by dielectric material within a circle (e.g., 129, 130). Ground plane 125, which connects to Layer 1 through numerous via connections, surrounds the circles.

FIGS. 12(c), (d), (e), (0 continue to illustrate Layers 3, 4, 5, 6, where signals 121, 122 continue to be routed through what has become a "coaxial" connector—conducting via in the middle, surrounded by dielectric material within a circle and bounded by ground planes' circular openings. The ratio of the diameter of the via for the signal to the diameter of the ground opening follows the formula for coaxial cables: Z=60 log(b/a)/[η×√ε]where "Z" is the desired impedance, "b" is the diameter of the opening, "a" is the diameter of the via, "ε" is the dielectric constant of the dielectric layer, and "η" is the efficiency of the capacitance between the ground openings to the center via as compared to that in a real coax cable of the same dimensions. "η" of course depends on layer thickness, "ε" and "b". It is typically in the order of 80%. Note that ground plane 125 has taken on different patterns from layer to layer. The pattern of the ground plane (except for the diameter of the openings) does not affect the impedance calculation described above, as most of the capacitance is between the edge of the opening and the center via for signal.

In FIGS. 12(g) and (h), while signal 121 continues in a coaxial manner, signal 122 is routed as internal stripline (traveling in the x-y plane) to another location, where it further continues as coaxial transmission line. Signals 121, 122 become striplines at different layers in order to facilitate routing and to keep their end-to-end electrical lengths the same.

In FIGS. 12(i), (j), (k), (l), signal 121 remains a coaxial transmission and signal 122 begins another coaxial transmission at a different location. Note that ground 125 is now patterned to surround the relocated signal 122 so that its coaxial transmission is continued.

In FIGS. 12(m), (n), (o) and (p), signal 121 becomes internal stripline to be relocated further out from its original location, while signal 122 continues its coaxial transmission downward. Note that for coaxial transmission, signal 121 becomes encircled by dielectric material, with ground plane formed outside the circle. In FIG. 12(q), signals 121, 122 terminate as contact points in an array of contacts, which will be connected to BGA solder balls through a reflow process.

While the present invention has been particularly described with reference to the various figures and embodiments, it should be understood that these are for illustration purposes only and should not be taken as limiting the scope of the invention. There may be many other ways to implement the invention. Many changes and modifications may be made to the invention, by one having ordinary skill in the art, without departing from the spirit and scope of the invention. For example, while references are made to the frequency range applicable to OC-768 optical transmission, the invention is not limited to OC-768/STM-256 transmission, and it may be utilized for frequencies below or above the frequency range of OC-768/STM-256 transmission. While BGA connectors are described for lower speed signal connection, the invention may utilize other low speed connectors including, without limitation, pin grid array ("PGA") connectors, and other surface mount connectors. For high-speed connectors, besides GPPO, other coaxial connectors may be used including, without limitation, GPO, K-type, V-type, 2.4 mm, SMA, and SMB. The present invention may utilize various substrate types. For example, for a single-layer substrate, a dielectric material such as a ceramic substrate including, without limitation, Alumina, Berylia, and glass may be employed. A multi-layer substrate may use a dielectric material including, without limitation, various HTCC (high temperature co-fired ceramic) materials and LTCC (low temperature co-fired ceramic) materials. While the invention is not limited to a particular size of a substrate, a single-layer substrate may be typically 2 inches×2 inches×10 mils in size, and a multi-layer substrate may be typically 1 inch×1 inch×100 mils in size. It should be also noted that the invention may be utilized in wired or wireless applications.

What is claimed is:

1. A method comprising:

providing a substrate;

forming a plurality of microstrips on said substrate,
at least a pair of said plurality of microstrips for transmitting signals,
said pair of said plurality of microstrips ("said pair of microstrips") for being capacitively coupled to each other, through a first length,
said pair of microstrips for having substantially constant characteristic impedance throughout substantially the entire length of said pair of microstrips,
wherein a width of each of said pair of microstrips along said first length is less than a width determined from an equation 50 ohm=I/vC, where v is a velocity of propagation of the signals and C is a capacitance per unit length.

2. The method of claim 1, wherein said pair of microstrips has a width that increases as it is outwardly routed.

3. The method of claim 1, wherein said substrate is made of substantially Alumina.

4. The method of claim 1, further comprising:
connecting a demultiplexor or multiplexor chip for OC-768 applications to said substrate.

5. The method of claim 1, wherein said signals comprise high-speed data signals operating at a rate of at least 20 Gbps.

6. The method of claim 1, further comprising:
coupling a pair of coaxial terminals to said pair of microstrips.

7. The method of claim 6, wherein a width of a dielectric ring portion of one of said pair of coaxial terminals is substantially identical to a thickness of said substrate.

8. The method of claim 1, wherein said first length is located substantially at a first end of said pair of microstrips,
wherein said first end is located near an inner edge of said substrate for receiving said signals from an integrated circuit ("IC").

9. The method of claim 1, wherein a width of each of said pair of microstrips along a portion of said first length is not more than 5 mils,
wherein spacing between said pair of microstrips along a portion of said first
length is not more than 5 mils.

10. The method of claim 1, wherein said pair of microstrips is substantially 50-ohm transmission lines throughout substantially the entire length of said pair of microstrips.

11. The method of claim 1, wherein said signals are differential signals.

12. The method of claim 1, wherein said substrate is a single-layer substrate.

13. The method of claim 1, wherein said substrate is a multiple-layer substrate.

14. The method of claim 1, further comprising:
coupling a GPPO connectors to said pair of microstrips.

15. The method of claim 1, wherein said pair of microstrips are for transmitting high-speed signals,
wherein said plurality of microstrips further comprise a second plurality of microstrips that are for transmitting low speed signals.

16. A method comprising:

providing a substrate;

forming a plurality of microstrips on said substrate,
at least a pair of said plurality of microstrips for transmitting signals,
said pair of said plurality of microstrips ("said pair of microstrips") for being capacitively coupled to each other, through a first length,
said pair of microstrips for having substantially constant characteristic impedance throughout substantially the entire length of said pair of microstrips,
wherein along a second length within said first length of said pair of microstrips, said pair of microstrips is widened to increase its capacitance.

17. The method of claim 16, wherein said second partial length is located substantially at a first end of said pair of microstrips,
wherein said first end is located near an inner edge of said substrate for receiving said signals from said an integrated circuit ("IC").

18. A method comprising:

providing a substrate;

forming a plurality of microstrips on said substrate,
at least a pair of said plurality of microstrips for transmitting signals,
said pair of said plurality of microstrips ("said pair of microstrips") for being capacitively coupled to each other, through a first length, said pair of microstrips for having substantially constant characteristic impedance throughout substantially the entire length of said pair of microstrips, coupling a pair of coaxial terminals to said pair of microstrips, wherein along a second length within said first length of said pair of microstrips, said pair of microstrips is widened to increase its capacitance.

19. A method for forming a package for at least one integrated circuit chip ("IC"), said IC for comprising at least one high speed signal and low speed signals, said method comprising:

providing a substrate for mounting said IC;

forming at least one external coaxial connector for communicating said high speed signal, forming a plurality of terminals on said substrate for communicating at least said low speed signals;

forming a plurality of first microstrips on said substrate,
at least one of said plurality of first microstrips being disposed for connecting said high speed signal between said IC and said at least one external coaxial connector,
at least another one of said plurality of first microstrips being disposed for connecting one of said low speed signals between said IC and one of said plurality of terminals;

forming a plurality of interconnections within said substrate, wherein at least one of said plurality of interconnections connects at least said at least another one of said plurality of first microstrips to at least said one of said plurality away of terminals, wherein said at least one of said plurality of first microstrips and said at least one external coaxial connector are for providing substantially constant characteristic impedance throughout substantially said at least one of said plurality of first microstrips and said at least one external coaxial connector, wherein said substrate comprises a plurality of dielectric layers formed by a low-temperature co-fired ceramics process, not a printed circuit board.

20. The method of claim 19, wherein a rate of said high speed signal is at least 20 Gbps, and a rate of one of said low speed signals is lower than 20 Gbps.

21. The method of claim 19, wherein said plurality of terminals comprises ball grid array ("BGA") connectors.

22. The method of claim 19, wherein said substrate comprises at least a first dielectric layer and a second dielectric layer, wherein a top surface of said substrate is a top surface of said first dielectric layer, wherein said step of forming a plurality of interconnections comprises:
forming a plurality of second paths between said first and second dielectric layers;
forming a plurality of third paths at a bottom of said second dielectric layer, wherein at least one of said plurality of second paths is for a ground signal and connected to at least one of said plurality of third paths through a via connection;

wherein said via connection is underneath said at least one of said plurality of first microstrips;

wherein said at least one of said plurality of second paths and said at least one of said plurality of third paths form a continuous ground path.

23. The method of claim 19, wherein said substrate comprises at least a first dielectric layer and a second dielectric layer, wherein a top surface of said substrate is a top surface of said first dielectric layer, wherein said step of forming a plurality of interconnections comprises:
forming a plurality of second transmission lines between said first and second dielectric layers;
forming a plurality of third transmission lines at a bottom of said second dielectric layer,
forming a plurality of first via connections in said first dielectric layer, and
forming a plurality of second via connections in said second dielectric layer, wherein one of said plurality of first via connections connects said at least another one of said plurality of first microstrips to one of said plurality of second transmission lines, wherein one of said plurality of second via connections connects said one of said plurality of second transmission lines to one of said plurality of third transmission lines, wherein said one of said plurality of first via connections is aligned with said one of said plurality of second via connections.

24. The method of claim 19, wherein said substrate comprises at least a first dielectric layer, a second dielectric layer, and a third dielectric layer wherein a top surface of said substrate is a top surface of said first dielectric layer, wherein said step of forming a plurality of interconnections comprises:
forming a plurality of second paths between said first and second dielectric layers;
forming a plurality of third paths between said second and third dielectric layers;
forming a plurality of fourth paths at a bottom of said third dielectric layer, wherein at least one of said plurality of second paths is for a ground signal and connected to at least one of said plurality of fourth paths through at least a first via connection and a second via connection;

wherein said at least another one of said plurality of first microstrips is connected to one of said plurality of third paths, wherein spacing between said first via connection and said second via connection is less than a wavelength of the highest frequency signal that is to be carried along said one of said plurality of third paths.

25. The method of claim 19, wherein said substrate comprises at least a first dielectric layer and a second dielectric layer, wherein a top surface of said substrate is a top surface of said first dielectric layer, wherein said step of forming a plurality of interconnections comprises:
forming a plurality of second paths between said first and second dielectric layers;
forming a plurality of third paths at a bottom of said second dielectric layer, wherein at least one of said plurality of second paths is for a ground signal and connected to at least one of said plurality of third paths through a via connection;

wherein a first portion of said at least one of said plurality of first microstrips is over a portion of said at least one of said plurality of second paths, wherein a second portion of said at least one of said plurality of first microstrips is over said via connection, wherein a third portion of said at least one of said plurality of first microstrips is over a portion of said at least one of said plurality of third paths, wherein said first portion is narrower than said third portion, wherein said second portion tapers out from said first portion toward said third portion, wherein said first portion, said second portion and said third portion are for providing substantially constant impedance along said first portion, said second portion said third portion.

26. A method for forming a package for at least one integrated circuit ("IC"), said IC for carving at least one high speed signal and low speed signals, said method comprising:
providing a substrate for mounting said IC;
forming at least one external coaxial connector for communicating said high speed signal,
forming a plurality of terminals on said substrate for communicating at least said low speed signals;
forming a plurality of first microstrips on said substrate,
at least one of said plurality of first microstrips being disposed for connecting said high speed signal between said IC and said at least one external coaxial connector,
at least another one of said plurality of first microstrips being disposed for connecting one of said low speed signals between said IC and one of said plurality of terminals;
forming a plurality of interconnections within said substrate,
wherein at least one of said plurality of interconnections connects at least said at least another one of said plurality of first microstrips to at least said one of said plurality of terminals,
wherein said at least one of said plurality of first microstrips and said at least one external coaxial connector are for providing substantially constant characteristic impedance throughout substantially said at least one of said plurality of first microstrips and said at least one external coaxial connector,
wherein said substrate comprises a plurality of dielectric layers formed by a high-temperature co-fired ceramics process.

27. The method of claim 26, wherein a rate of said high speed signal is at least 20 Gbps, and a rate of one of said low speed signals is lower than 20 Gbps.

28. The method of claim 26, wherein said at least another one of said plurality of first microstrips is for providing substantially constant characteristic impedance,
wherein at least one of said plurality of interconnections is for providing substantially constant characteristic impedance throughout said at least one of said plurality of interconnections connecting at least said at least another one of said plurality of first microstrips to at least said one of said plurality of terminals.

29. The method of claim 26, wherein said at least one external coaxial connector is placed on a side of said substrate.

30. The method of claim 26, said high speed signal does not transmit through said substrate.

31. The method of claim 26, wherein said at least one external coaxial connector comprises a GPPO connector.

32. The method of claim 26, wherein said plurality of terminals comprises ball grid array ("BGA") terminals.

33. The method of claim 26, wherein said substrate comprises at least a first dielectric layer and a second dielectric layer.

34. The method of claim 26,
wherein said substrate comprises at least a first dielectric layer and a second dielectric layer,
wherein a top surface of said substrate is a top surface of said first dielectric layer,
wherein said step of forming a plurality of interconnections comprises:
forming a plurality of second paths between said first and second dielectric layers;
forming a plurality of third paths at a bottom of said second dielectric layer,
wherein at least one of said plurality of second paths is for a ground signal and connected to at least one of said plurality of third paths through a via connection;
wherein said via connection is underneath said at least one of said plurality of first microstrips;
wherein said at least one of said plurality of second paths and said at least one of said plurality of third paths form a continuous ground path.

35. The method of claim 34,
wherein said at least one of said plurality of second paths is for providing substantially constant characteristic impedance along said at least one of said plurality of second paths;
wherein said via connection is for providing substantially constant characteristic impedance along said via connection;
wherein said at least one of said plurality of third paths is for providing substantially constant characteristic impedance along said at least one of said plurality of third paths.

36. The method of claim 34, further comprising:
tapering out said at least one of said plurality of first microstrips at a tapering section, wherein said via connection is underneath said tapering section.

37. The method of claim 26,
wherein said substrate comprises at least a first dielectric layer and a second dielectric layer,
wherein a top surface of said substrate is a top surface of said first dielectric layer,
wherein said step of forming a plurality of interconnections comprises:
forming a plurality of second transmission lines between said first and second dielectric layers;
forming a plurality of third transmission lines at a bottom of said second dielectric layer,
forming a plurality of first via connections in said first dielectric layer, and
forming a plurality of second via connections in said second dielectric layer,
wherein one of said plurality of first via connections connects said at least another one of said plurality of first microstrips to one of said plurality of second transmission lines,
wherein one of said plurality of second via connections connects said one of said plurality of second transmission lines to one of said plurality of third transmission lines, wherein said one of said plurality of first via connections is aligned with said one of said plurality of second via connections.

38. The method of claim 26,
wherein said at least one of said plurality of first microstrips comprises a first length near an inner edge of said substrate and a second length toward an outer edge of said substrate,
wherein a width along said second partial length is wider than a width along a portion of said first length.

39. The method of claim 38,
wherein said first length comprises a third length and a fourth length,
wherein said third length is closer to said inner edge than said fourth length is to said inner edge,
wherein a width along said third length is wider than a width along said fourth length.

40. The method of claim 26,
wherein said substrate comprises at least a first dielectric layer, a second dielectric layer, and a third dielectric layer
wherein a top surface of said substrate is a top surface of said first dielectric layer,
wherein said step of forming a plurality of interconnections comprises:
  forming a plurality of second paths between said first and second dielectric layers;
  forming a plurality of third paths between said second and third dielectric layers;
  forming a plurality of fourth paths at a bottom of said third dielectric layer,
wherein at least one of said plurality of second paths is for a ground signal and connected to at least one of said plurality of fourth paths through at least a first via connection and a second via connection;
wherein said at least another one of said plurality of first microstrips is connected to one of said plurality of third paths,
wherein spacing between said first via connection and said second via connection is less than a wavelength of the highest frequency signal that is to be carried along said one of said plurality of third paths.

41. The method of claim 40,
wherein spacing between said first via connection and said one of said plurality of third paths is about half of a separation between said at least one of said plurality of second paths and a said at least one of said plurality of fourth paths.

42. The method of claim 26, wherein said substrate is less than 0.4 cubic inches.

43. The method of claim 26,
wherein said substrate comprises at least a first dielectric layer and a second dielectric layer,
wherein a top surface of said substrate is a top surface of said first dielectric layer,
wherein said step of forming a plurality of interconnections comprises:
  forming a plurality of second paths between said first and second dielectric layers;
  forming a plurality of third paths at a bottom of said second dielectric layer,
wherein at least one of said plurality of second paths is for a ground signal and connected to at least one of said plurality of third paths through a via connection;

wherein a first portion of said at least one of said plurality of first microstrips is over a portion of said at least one of said plurality of second paths,
wherein a second portion of said at least one of said plurality of first microstrips is over said via connection,
wherein a third portion of said at least one of said plurality of first microstrips is over a portion of said at least one of said plurality of third paths,
wherein said first portion is narrower than said third portion,
wherein said second portion tapers out from said first portion toward said third portion,
wherein said first portion, said second portion and said third portion are for providing substantially constant impedance along said first portion, said second portion and said third portion.

44. A method for forming a package for at least one integrated circuit ("IC"), said IC for carrying at least one high speed signal and low speed signals said method comprising:
providing a substrate for mounting said IC;
forming at least one external coaxial connector for communicating said high speed signal,
forming a plurality of terminals on said substrate for communicating at least said low speed signals;
forming a plurality of first microstrips on said substrate,
  at least one of said plurality of first microstrips being disposed for connecting said high speed signal between said IC and said at least one external coaxial connector,
  at least another one of said plurality of first microstrips being disposed for connecting one of said low speed signals between said IC and one of said plurality of terminals;
forming a plurality of interconnections within said substrate,
wherein at least one of said plurality of interconnections connects at least said at least another one of said plurality of first microstrips to at least said one of said plurality of terminals,
wherein said at least one of said plurality of first micro strips and said at least one external coaxial connector are for providing substantially constant characteristic impedance throughout substantially said at least one of said plurality of first microstrips and said at least one external coaxial connector,
wherein said step of forming a plurality of first microstrips comprises:
  forming at least a ground path for said at least one of said plurality of first microstrips ("high-speed microstrin";
  widening said high-speed microstrip through a second partial length to increase its capacitance,
wherein said around path is for being capacitively coupled to said high-speed microstrip through a first length.

45. A method for forming a package for at least one integrated circuit ("IC"), said IC for carrying at least one high speed signal and low speed signals, said method comprising:
providing a substrate for mounting said IC;
forming at least one external coaxial connector for communicating said high speed signal,
forming a plurality of terminals on said substrate for communicating at least said low speed signals;

forming a plurality of first microstrips on said substrate,
at least one of said plurality of first microstrips being disposed for connecting said high speed signal between said IC and said at least one external coaxial connector,
at least another one of said plurality of first microstrips being disposed for connecting one of said low speed signals between said IC and one of said plurality of terminals;
forming a plurality of interconnections within said substrate,
wherein at least one of said plurality of interconnections connects at least said at least another one of said plurality of first microstrips to at least said one of said plurality of terminals,
wherein said at least one of said plurality of first microstrips and said at least one external coaxial connector are for providing substantially constant characteristic impedance throughout substantially said at least one of said plurality of first microstrips and said at least one external coaxial connector,
wherein one of said plurality of interconnections comprises a via connection,
wherein said via connection comprises a conductor core for a signal,
wherein said conductor core is surrounded by a dielectric material portion of said substrate and bound by a circular opening for a ground signal,
wherein said via connection's impedance is determined substantially by:

$$60 \log(b/a)/[\eta \times \sqrt{\in}]$$

wherein b is a diameter of said circular opening, a is a diameter of said conductor core, $\in$ is a dielectric constant of said dielectric material portion, and 11 is an efficiency of a capacitance between said circular opening and said conductor core as compared to that in a coaxial cable having same a and b dimensions.

46. A method for making a package for connecting at least one integrated circuit ("IC") to a plurality of terminals, comprising:
providing a substrate comprising a plurality of dielectric layers;
forming a plurality of microstrips on said substrate, at least one of said plurality of microstrips ("high-speed microstrip") being disposed for conducting a high speed signal between said IC and one of said plurality of terminals;
forming at least a first ground path near said high-speed microstrip, said first around path for being capacitively coupled to said high-speed microstrip at least through a first length of said high-speed microstrip;
forming a second around path at a first vertical distance below said high-speed microstrip in said substrate;
forming a third around path at a second vertical distance below said high-speed microstrip in said substrate;
forming at least one via connector to connect said second and third around paths;
forming a plurality of internal striplines in said substrate, said plurality of internal striplines for connecting signals between said IC and a second set of terminals;
forming a plurality of internal coaxial connectors in said substrate, being adapted for connecting said plurality of internal striplines through said substrate;
widening said high-speed microstrip through a second length while maintaining its capacitance.

47. The method of claim 46, further comprising:
forming said at least one via connector below said high-speed microstrip.

48. The method of claim 46, wherein said one of said plurality of terminals connected to said high-speed microstrip is a coaxial GPPO connector.

49. The method of claim 46, wherein said second set of terminals are BGA connectors.

50. The method of claim 46, wherein said high-speed microstrip is capable of carrying a signal at a rate of at least 30 Gbps.

51. The method of claim 46, further comprising:
forming at least a pair of said plurality of microstrips to connect a pair of high-speed differential signals.

52. The method of claim 46, wherein said one of said plurality of terminals is a coaxial connector,
wherein said second set of terminals are BGA connectors,
wherein said high-speed microstrip is for carrying a differential signal,
wherein said high-speed microstrip is for having substantially constant characteristic impedance throughout substantially the entire length of said high-speed microstrip,
wherein said high-speed microstrip is for carrying a signal at a rate of at least 30 Gbps,
wherein said capacitance to ground.

53. A method for forming a package for an integrated circuit ("IC") said method comprising:
providing a substrate comprising a plurality of dielectric layers;
providing a plurality of coaxial connectors;
providing a plurality of BGA connectors;
forming a plurality of microstrips on a first layer of said plurality of dielectric layers, being disposed for connecting to said IC,
some of said plurality of microstrips ("first microstrips" coupled to said plurality of coaxial connectors;
forming a plurality of internal connections on a second layer of said plurality of dielectric layers;
forming a plurality of inter-layer connections in said substrate, said plurality of inter-layer connections coupling some of said plurality of microstrips ("second microstrips") to said plurality of internal connections and coupling said plurality of internal connections to said plurality of BGA connectors,
wherein said plurality of microstrips comprise a pair of microstrips for high speed differential signals and a plurality of ground paths, said pair of microstrips for high speed differential signals for being capacitively coupled to said plurality of ground paths through a first length;
wherein said pair of microstrips for high speed differential signals are widened in width from an inner edge of said substrate to an outer edge of said substrate, said pair of microstrips for high speed differential signals for maintaining their capacitance substantially constant.

54. The method of claim 53,
wherein said step of forming a plurality of internal connections comprises:
forming internal striplines to connect active signals; and
forming ground strips to connect to ground;
wherein said step of forming a plurality of inter-layer connections comprises:

forming internal coaxial conductors to connect active signals;

forming via connectors to connect to ground.

55. The method of claim 53, a path throughout substantially said first microstrips and said plurality of coaxial connectors for providing substantially constant impedance, wherein a rate of said high speed differential signals is at least 20 Gbps.

56. The method of claim 53, wherein said plurality of ground paths comprise three co-planar ground strips.

* * * * *